(12) United States Patent
Kermani

(10) Patent No.: US 11,435,905 B1
(45) Date of Patent: *Sep. 6, 2022

(54) ACCURATE AND EFFICIENT DNA-BASED STORAGE OF ELECTRONIC DATA

(71) Applicant: Bahram Ghaffarzadeh Kermani, Los Altos, CA (US)

(72) Inventor: Bahram Ghaffarzadeh Kermani, Los Altos, CA (US)

(*) Notice: Subject to any disclaimer, the term of this patent is extended or adjusted under 35 U.S.C. 154(b) by 488 days.

This patent is subject to a terminal disclaimer.

(21) Appl. No.: 16/571,179

(22) Filed: Sep. 15, 2019

Related U.S. Application Data

(63) Continuation of application No. 15/180,004, filed on Jun. 11, 2016, now Pat. No. 10,423,341.

(60) Provisional application No. 62/175,209, filed on Jun. 12, 2015.

(51) Int. Cl.
| | | |
|---|---|---|
| *G06F 3/06* | (2006.01) | |
| *G06F 11/10* | (2006.01) | |
| *H03M 13/15* | (2006.01) | |
| *B01J 19/00* | (2006.01) | |

(52) U.S. Cl.
CPC ........ *G06F 3/0619* (2013.01); *B01J 19/0046* (2013.01); *G06F 3/064* (2013.01); *G06F 3/0673* (2013.01); *G06F 11/1076* (2013.01); *H03M 13/1515* (2013.01); *B01J 2219/00587* (2013.01); *B01J 2219/00596* (2013.01); *B01J 2219/00722* (2013.01)

(58) Field of Classification Search
CPC ...... G06F 3/0619; G06F 3/064; G06F 3/0673; G06F 11/1076; B01J 19/0046; B01J 2219/00587; B01J 2219/00596; B01J 2219/00722; H03M 13/1515
See application file for complete search history.

(56) References Cited

U.S. PATENT DOCUMENTS

| | | | |
|---|---|---|---|
| 2005/0053968 A1 | 3/2005 | Bharadwaj | |
| 2015/0261664 A1* | 9/2015 | Goldman | ............... G16B 30/00 711/154 |
| 2015/0269313 A1* | 9/2015 | Church | ............... G06K 19/022 235/487 |
| 2017/0243115 A1* | 8/2017 | Chen | ..................... G11C 7/1006 |

OTHER PUBLICATIONS

Grass et al., Robust Chemical Preservation of Digital Information on DNA in Silica with Error-Correcting Codes, V.54, Issue 8, Feb. 16, 2015, pp. 2552-2555, Feb. 4, 2015.

Goldman et al., Towards practical, high-capacity, low-maintenance information storage in synthesized DNA, Nature, Feb. 7, 2013, 494(7435):77-80, doi: 10.1038/nature11875, Epub Jan. 23, 2013.

(Continued)

*Primary Examiner* — Kyle Vallecillo

(57) ABSTRACT

Techniques for DNA-based storage of electronic data are described herein. In an example embodiment, a plurality of files is stored in deoxyribonucleic acid (DNA)-based storage. The plurality of files is encoded in a set of DNA oligos, where a DNA synthesizer system synthesizes first DNA oligos that encode first type of segments from the plurality of files and second DNA oligos that encode second type of segments from the plurality of files, and where the first DNA oligos are synthesized in excess compared to the second DNA oligos.

20 Claims, 5 Drawing Sheets

Specification includes a Sequence Listing.

(56) References Cited

OTHER PUBLICATIONS

USPTO Restriction Requirement for U.S. Appl. No. 15/180,004, dated Sep. 21, 2018, 9 pages.
USPTO Office Action for U.S. Appl. No. 15/180,004, dated Jan. 15, 2019, 9 pages.
USPTO Notice of Allowance for U.S. Appl. No. 15/180,004, dated May 17, 2019, 8 pages.

* cited by examiner

ACCURATE AND EFFICIENT DNA-BASED STORAGE OF ELECTRONIC DATA

PRIORITY

This application is a continuation of U.S. application Ser. No. 15/180,004 filed on Jun. 11, 2016, which claims the priority and benefit of U.S. Provisional Application No. 62/175,209, filed on Jun. 12, 2015, all of which are incorporated by reference herein.

SEQUENCE LISTING

The Sequence Listing written in file BK0020_seq_ST25.txt, created on Jun. 10, 2016, 1,150 bytes, machine format IBM-PC, MS-Windows operating system, is hereby incorporated by reference.

TECHNICAL FIELD

This disclosure generally relates information storage, and more specifically to accurate and efficient storage of computer files as deoxyribonucleic acid (DNA) molecules.

BACKGROUND

Conventionally, computer (e.g., electronic) files are stored on computer-readable media such as, for example, electromagnetic storage media, optical storage media, magneto-optical storage media, etc. Recent advances in biotechnology, however, have made it possible to store information on new types of storage media such as, for example, DNA-based storage media. However, current DNA-based storage technology suffers from several disadvantages.

For example, one major disadvantage of current DNA-based storage technology is that it provides for storing only a very limited number of constructs (i.e., only address and content) on any given DNA oligonucleotide (oligo). Thus, the current DNA-based storage technology suffers from at least the following problems: (1) it provides for storing only one file at a time, which is not practical; (2) it is limited to files of a very small size (~700 KB), due to the inefficiency of encoding; (3) it involves a high probability of error, due to the lack of redundant bases and error correction; (4) it uses either uniform encoding of all parts of a target file (which allows for encoding errors to impact the whole content of the file) or, alternatively, it uses increased coverage that provides redundancy by encoding the same information onto large number of oligos (which makes the use of the technology less economically feasible); (5) it is not economical for large files and, more generally, for large blocks of information; and (6) it requires expensive DNA sequencing, due to the requirement of high coverage stemming from the error-prone nature of the encoding processes.

DETAILED DESCRIPTION

Figure 1:
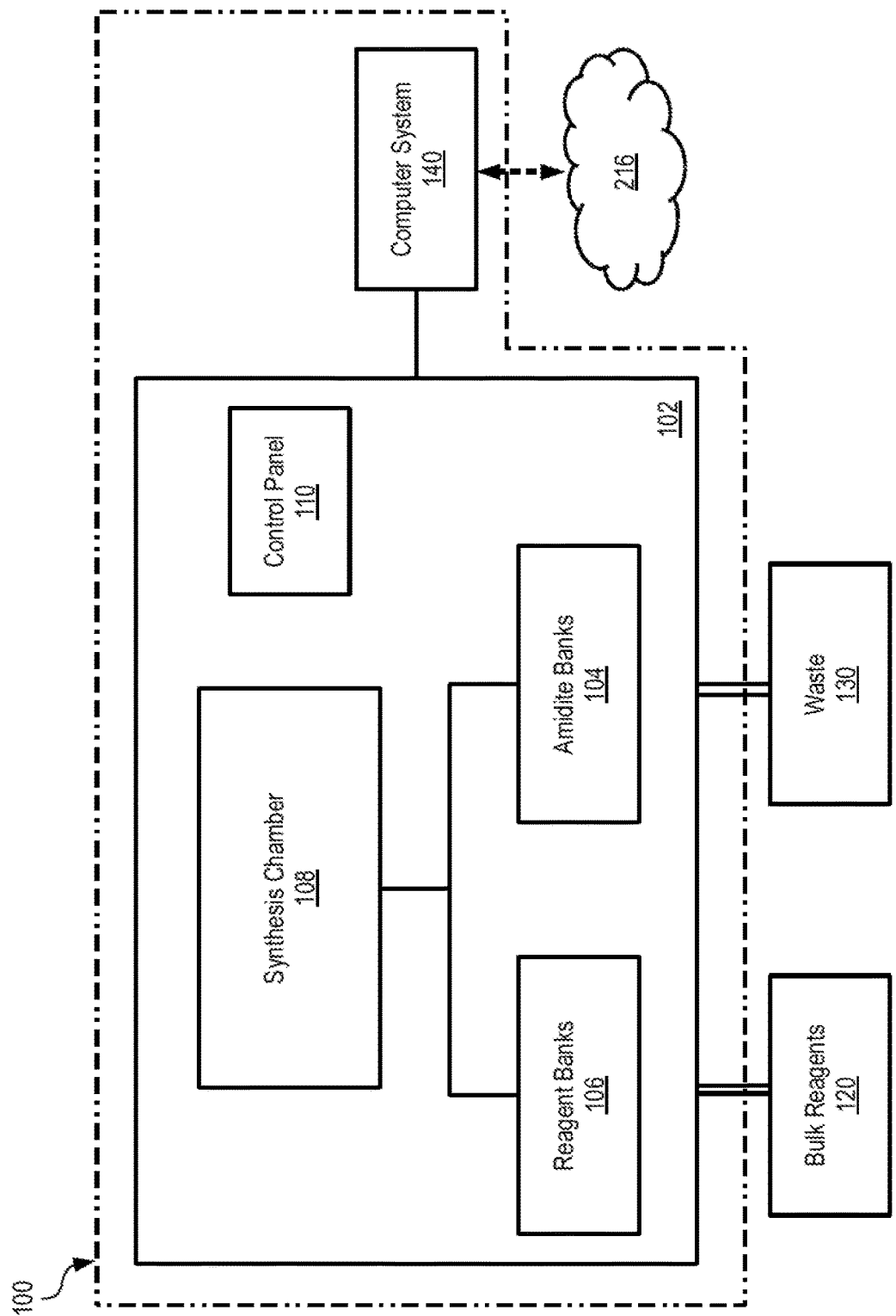
FIG. 1 illustrates an example DNA synthesizer system, according to some embodiments.

The following description sets forth numerous specific details such as examples of specific systems, components, methods, and so forth, in order to provide a good understanding of various embodiments of the techniques described herein for DNA-based storage of electronic data/information. It will be apparent to one skilled in the art, however, that at least some embodiments may be practiced without these specific details. In other instances, well-known components, elements, or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the present invention.

Reference in the description to "an embodiment", "one embodiment", "an example embodiment", "some embodiments", and "various embodiments" means that a particular feature, structure, or characteristic described in connection with the embodiment(s) is included in at least one embodiment of the invention. Further, the appearances of the phrases "an embodiment", "one embodiment", "an example embodiment", "some embodiments", and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Overview

Described herein are various embodiments of techniques for DNA-based storage of electronic data. The techniques described herein provide for one or more of the following:

1. Encoding a file system. The techniques described herein provide for encoding, in a DNA oligo mix (mixture), a file system (e.g., not a single file) and the directory structure thereof, and for decoding the directory structure including one or many files.

2. Encoding a file identifier (fileID) into each DNA oligo in the DNA mix. For example, each file to be encoded (e.g., a target file) has a line of metadata in the file system identifying its directory path and its file type, where a file type (via extension, etc.) defines the type of file, e.g., txt, csv, tif, jpg, bmp, etc.

3. Encoding the exact binary format of the target file. Most binary files have two main sections—header and data. The header part may be small, yet more important, as its loss will equate the complete loss of the data. The data part, on the other hand is important but its partial loss could result in a partial loss of the contents, e.g., a part of an image missing. Therefore, such loss may not be considered detrimental.

4. Using asymmetric number of oligos. The techniques described herein provide for assigning asymmetric number of oligos, in the DNA oligo mix, to different parts of the context—e.g., the more essential parts (e.g., the file system or the header parts) get more redundancy (higher oligo count) than the less essential parts (e.g., such as data/content of a file). As mentioned heretofore, this ensures encoding errors would have less chance of making detrimental effects on the decoding operations.

5. Including error correcting codes in each DNA oligo. For example, block-type error correction (e.g., Reed-Solomon type error correction) is one of the most appropriate mechanisms, but other error correction mechanisms could also be applied. In general, a large Hamming distance between different codes is desirable. However, a single-base mutation is not the only alteration that may be expected to occur in DNA oligo synthesis and DNA sequencing. For example, in the case of DNA oligo synthesis, base insertion and loss of incorporation are common events. Thus, the use of error correcting codes that are resilient to such errors is effective for the techniques described herein. It is noted that for DNA oligo synthesis, an insertion/deletion error is a function of technology. For sequencing, sequencing-by-synthesis (SBS) is more resilient to this type of error, while some electronic-based sequencing techniques are not.

6. Providing a code set that uses black-listed codes. In order to minimize the chance of error in oligo synthesis or DNA sequencing, the codes' snippets that are problematic, like GGG (SEQ ID NO:1) (for synthesis) or long homo-polymers (for sequencing) are eliminated from the complete code set (e.g., such code snippets are not allowed/used to encode information). By way of example, the mapping of bits to DNA base-pairs may be performed by first constructing a lookup table, where the undesirable codes are not existent in the outputs of the lookup table. For instance, a code like 1111111 does not end up mapping to AAAAA (SEQ ID NO:2). Instead, it will map to a code like TGAAC (SEQ ID NO:3), which is void of the homo-polymer issue. A similar mechanism can be used to avoid using other sequences that are difficult to synthesize or to sequence. The black-list could also include the k-mers that exist in human DNA (and perhaps the DNA of some other species). This is to make sure that any contamination from such sources will not affect the decoded data as false positives.

7. Using base-4 code sets. The techniques described herein use the full power of base-4 encoding, i.e., A, C, G, and T each encode for two bits, in general. This is in contrast with conventional techniques that use base-2 encoding (e.g., such as A,C=0 and G,T=1). Therefore, the encoding power of the techniques described herein is quite higher than what conventional techniques provide. It is noted that the conventional techniques' need to use base-2 encoding stems from the fact that such techniques are missing a black-list functionality, and the base-2 encoding enables them to prevent the homo-polymer problem by arbitrarily assigning a random sequence made of the two possible bases, e.g., 11111=GTGTT (SEQ ID NO:4). The techniques described herein solve this problem via the black-list functionality, and therefore do not need to sacrifice the encoding power.

Examples of Encoding/Decoding Code Sets

In some embodiments, the techniques described herein provide code sets that use base-4 encoding. For example, in some embodiments the base-4 code set may be based on the encoding illustrated in Table 1A below.

TABLE 1A

Example code set of a base-4 encoding

| Electronic Bits | Encoding Sequence of DNA Bases |
|---|---|
| 00 | A |
| 01 | C |
| 10 | G |
| 11 | T |

The base-4 encoding in Table 1A illustrates that each base (e.g., A, C, G, or T) in a DNA oligo encodes for two bits. In some embodiments, this base-4 encoding (when augmented with redundant bases) is used in conjunction with a black-list that includes disallowed codes, thereby allowing the techniques described herein to use to full encoding power of the four DNA bases.

Table 1B below illustrates an example code set that adds redundancy to avoid black-list codes. For instance, if a run of two Gs (GG) needs to be avoided in the sequence of the resulting DNA oligo, the encoding mechanism in Table 1B can be used. As can be seen, no combination of electronic bits would result in a GG in the resulting sequence.

TABLE 1B

Example code set of base-4 encoding with redundancy

| Electronic Bits | Encoding Sequence of DNA Bases |
|---|---|
| 00 | AC |
| 01 | CT |
| 10 | AG |
| 11 | TC |

Additionally or instead of, this base-4 encoding code set may also be used in conjunction with codes that use block-type error correction. Reed-Solomon encoding is a good example of block-type error correction, where for a series of bases, additional parity base(s) are introduced during encoding, where they help in detection and/or correction of the errors during decoding. Below, is a simple demonstration of a block-code set in Table 1C:

TABLE 1C

Example code set of base-4 encoding with redundancy for block codes

| Electronic Bits | Encoding Sequence of DNA Bases | Encoded Bases with Parity Bases Added to Make Block Codes |
|---|---|---|
| 00 | A | AC |
| 01 | C | CG |
| 10 | G | GT |
| 11 | T | TA |

It is noted that the encodings in Tables 1A-1C are merely example code sets of base-4 encodings, encodings with redundancy, and encodings with redundancy for block codes. As another example, Table 1D below illustrates example code sets of encodings that use different sequences to represent electronic bits:

TABLE 1D

Other example code sets of encodings

| Electronic Bits | Base-4 Encoding | Encoding with Redundancy | Other Encoding with Redundancy |
|---|---|---|---|
| 00 | T | TC | TG |
| 01 | G | GA | GC |
| 10 | C | TA | CA |
| 11 | A | AG | AT |

Thus, the example code sets in Tables 1A-1D above are to be considered in an illustrative rather than a restrictive sense.

In some embodiments, the techniques described herein provide code sets that use base-8 encoding. For example, in some embodiments a base-8 code set may be based on the encoding illustrated in Table 1E below.

TABLE 1E

Example code set of a base-8 encoding

| Electronic Bits | Encoding Sequence of DNA Bases |
|---|---|
| 000 | AC |
| 001 | CT |
| 010 | TG |
| 011 | GA |
| 100 | AT |
| 101 | TG |
| 110 | GT |
| 111 | CA |

The code set of the base-8 encoding in Table 1E illustrates that each sequence of two bases (e.g., AC, CT, ... ) in a DNA oligo encodes for three electronic bits. It is noted that there is inherent redundancy in the base-8 encoding illustrated in Table 1E because not all two-base combinations are used to code all the three-bit combinations. Table 1E also illustrates that some 2-base sequences such as GC or CG (e.g., a black-listed code) is not used since synthesizing such 2-base sequences may be error prone for some DNA synthesizing systems.

In some embodiments, the above code set of base-8 encoding is used in conjunction with a black-list that includes disallowed codes, thereby allowing the techniques described herein to use to full encoding power of the four DNA bases. In addition or alternatively, such base-8 encoding may also be used in conjunction with codes that use block-type error correction.

Code Sets with Black-Listed Codes

In some embodiments, the techniques described herein provide for use of black-listed codes. An example method for encoding by using black-listed codes may include the following operations. First, the electronic bits that comprise the target data are converted into DNA bases by using a base-4 encoding (e.g., each pair of consecutive bits is mapped to a corresponding DNA base). Then, parity bases are added to each pair of bits in order to provide redundancy. After this redundancy is introduced, some combinations of bases are removed and replaced with other corresponding, unique combinations of bases. For example, after redundancy is introduced, each sequence of N bases in the resulting mapping is checked against a lookup table that includes a list of prohibited codes (e.g., black-listed codes), where the lookup table returns a replacement sequence if the sequence of N bases is blacklisted. An example method of decoding involves the same operations applied in reverse order after a mix of DNA oligos is sequenced.

In some embodiments, the black-listed codes are the total available codes (using the number of bases used) minus the base codes that are actually used. For instance, in the code set illustrated in Table 1E above, there are a total of 4+3+2+1=10 two-base codes possible, of which only 8 codes are used. Therefore, the other 2 codes are considered as black-listed. In other words, in this instance the black list includes the codes that are not desirable for use in encoding.

In some embodiments, some codes (e.g., black-listed codes) may need to be removed from the code set because of problems with DNA oligo synthesis (synthesis-related black-list codes), because of problems with DNA sequencing (sequencing-related black-list codes), or both. It is noted that in various embodiments and implementations, synthesis-related black-list codes may depend on the type of DNA synthesizer systems used to convert the target electronic data into DNA-based storage, while the sequencing-related black-list codes may depend on the type of DNA sequencing systems used in the retrieval of the electronic data from the DNA-based storage. For example, it is noted that DNA oligos with runs of GC, or C, or G, are undesirable for purposes of accurate synthesis, so some embodiments exclude such codes from the code set. In another example, DNA oligos with extremely low or high GC contents are not desirable, and/or AT-rich DNA oligos, and/or GC-rich DNA oligos are undesirable for purpose of sequencing, so some embodiments exclude such codes from the code set. In this manner, the techniques described herein provides for a careful encoding design that uses a black-list to avoid undesirable codes, even in adjacent-code scenario in which allowed codes placed sequentially may give rise to a black-listed code (e.g., through a synthesis or a sequencing error).

Examples of Block-Type Error Correction

In some embodiments, the techniques described herein may use block-type error correction during encoding and decoding of electronic data. For example, Reed-Solomon type error correction may be used (see e.g., U.S. Pat. No. 8,407,554, which incorporated by reference herein and which describes Reed-Solomon error correction in the context of DNA sequencing).

For example, in some embodiments encoding of target electronic data with Reed-Solomon error correction may involve a computer system performing the following steps:
  1. Divide the binary sequence of the target electronic data into small binary segments (e.g., segments of 3 bits).
  2. Start from an empty DNA sequence, which is designated as the current DNA sequence.
  3. Start from the first segment, which is designated as the current binary segment.
  4. For the current binary segment, perform a lookup operation into the applicable code set to find the short DNA sequence corresponding to the sequence of electronic bits in the current binary segment. It must be noted that due to technical reasons (e.g., available memory), the lookup operation may need to be done via a dynamic algorithm. Therefore, the term lookup is only used for concept description, and not necessarily the implementation.
  5. Augment the current DNA sequence with the short DNA sequence determined in Step 4.
  6. Designate the next segment of the target data as the current binary segment, and repeat Steps 4-5 for that next segment.

7. Once the length of the current DNA sequence reaches a maximum allowed number (e.g., 90 bases) or all the binary segments have been processed, the current DNA sequence is complete.
8. Generate synthesizer instructions to generate a DNA oligo corresponding to the current DNA sequence and its index.
9. Determine whether all the binary segments have been processed; if not, perform Steps 2-8 starting from the next unprocessed binary segment.

In this manner, each binary segment of the target electronic data (which includes the offset and data bases) will provide the extra bases for oversampling that is needed to perform Reed-Solomon error detection or correction. The above operations will encode the data and the index of each binary segment into a DNA oligo. In some embodiments, the number of bases for the index will be constant. For instance, the first 10 bases of a DNA oligo could always correspond to the index, and the next 90 bases of the DNA oligo could always correspond to the corresponding binary segment of the target data.

In some embodiments, decoding a mix that includes of a set of DNA oligos with Reed-Solomon error correction may involve a computer system performing the following steps:
1. Each DNA oligo in the mix is assembled from reads obtained from sequencing the set of DNA oligos on a DNA sequencing system.
2. For each DNA oligo, a Reed-Solomon decoding is performed based on the observed bases. Using Reed-Solomon decoding algorithm, any errors in the bases of the DNA oligo (up to the capacity of the Reed-Solomon's encoding) are detected and/or corrected.
3. The decoded bases are decomposed into the index and data part.
4. The index of each DNA oligo is translated into an index number (e.g., used as the file offset).
5. The non-index bases of each DNA oligo are translated into a sequence of binary bits, to make up the data part of the binary segment corresponding to that DNA oligo.
6. The target/encoded electronic data (e.g., such as a file) is then assembled by using the index numbers of the DNA oligos to place the corresponding binary segments at the correct offsets in the target data.

It is noted that in some embodiments, the DNA-based storage (e.g., a set of DNA oligos in a mix) may include multiple copies of the same DNA oligo. For example, during encoding operations, multiple copies of a DNA oligo will be synthesized, so there are enough molecules to cover the same binary segment at the same offset in the target data (e.g., synthesis in excess or in super excess, as described below). Subsequently, when the sequences are read, there may be multiple reads from the same index/data. This redundant information can be used to recover from errors in data, e.g., by voting or other data aggregation techniques. In some other embodiments, the redundant sequences could be partial and not complete. For instance, the data for two oligos could overlapping by 50%. In this case, for the overlapping part, the read bases can be corrected similar to the above, e.g., via voting.

File System Encoding (Synthesized in Super Excess)

In some embodiments, the techniques described herein provide storing electronic data that is organized in a file system. For example, in some operational scenarios a user may not be interested in making an oligo mix (e.g., as stored in a tube) for just one entity, e.g., such as one image. Instead, it is assumed that the user is interested in encoding a series of files (optionally in a directory structure) in the mix (tube). In its simple form, all such files may be in the same directory, and therefore there is no need for a path. However, each file will have a filename and a file type. In some cases, however, the filename may be optional, and the file type may also be optional if all files are of the same type.

Nevertheless, in the most general case (e.g., such as backing up all the files on the user's computer), it should be assumed that the target files (the files to be encoded and stored in the DNA-based storage) are in different directories (e.g., possibly nested), that each file has a name, and that the files may have many different file types. Therefore, in such most general case, an example encoding may be as follows:
Path (e.g., dir1/dir2/ . . . )—allocated 250 characters, 250 bytes, or 1000 DNA base-pairs (bp)
Filename (e.g., abcdef.xyz)—allocated 250 characters, 250 bytes, or 1000 bp
Filetype (e.g., jpg, mpg, tif, etc.)—allocated 256 ($4^4$) different types, or 5 bp Alternatively, such need may be alleviated by keeping the file types in the files themselves.

According to the techniques described herein, since the file system is crucial for lossless encoding/decoding operation, the file system can be encoded in super excess quantity, e.g., more oligos (per base or per bit) than average can be specified for this purpose. As used herein, "super excess" refers to generating, in the DNA oligo mix, multiple (nX) copies of the same DNA oligo, where nX may be in the range of 10× to 100× and/or in any sub-range thereof. For example, in some embodiments the techniques described herein provide for use of super excess during encoding in a range of 90×-100×, or a range of 80×-90×, or a range of 70×-80×, or a range of 60×-70×, or a range of 50×-60×, or a range of 40×-50×, or a range of 30×-40×, or a range of 20×-30×, or a range of 10×-20×, or any combination of such ranges.

In some embodiments, the techniques described herein provide for using indexing to keep track of the sequential order of the blocks of the target data's electronic bits. For example, during encoding, a computer system may automatically divide the file system data into segments of bits and assign a sequential index value to each segment to reflect the position/offset of this segment within the file system data. Thereafter, each segment along with its index value is encoded into DNA bases as described herein, and a DNA oligo representing the segment and its index value is generated by a DNA synthesizing system (e.g., in super-excess number of copies). During retrieval from the DNA-based storage, the DNA oligos are first sequenced using a DNA sequencing system to generate a set of reads and the set of reads are decoded into segments of electronic bits as described herein. Thereafter, a computer system may assemble the original file system data by using the index value of each segment of bits to determine the position/offset of the segment into the file system data.

In some embodiments, during encoding a designated number of bases at the beginning of each synthesized DNA oligo may be used to identify whether the DNA oligo encodes part of a file system and/or part of a file. For example, the first three bases in a DNA oligo may be synthesized as ACG to indicate that the DNA oligo corresponds to a part of the file system, while TCA may be synthesized to indicate that the DNA oligo corresponds to a part of a file. Then, for DNA oligos that correspond to a file, a few extra bases (after the file-system/file designating bases) may be designated in each oligo to indicate which file the contents are from. Alternatively, each DNA oligo can be encoded to include an index which comprises a first index for the file system and a second (possibly different) index for a file.

File Header Encoding (Synthesized in Excess)

In some embodiments, the techniques described herein provide for encoding the target files based on whether such files are binary files or other types of files (e.g., such as text files). For example, binary files are composed of a header portion and one or more data portions that store sequences of bits (0s and 1s). Other files, including the text files can be encoded byte by byte.

According to the techniques described herein, a file ID may be assigned to each file. The file ID may include a unique file identifier and one or more key-value pairs that are stored in the file header (e.g., such as a file metadata table). A key-value pair in a file ID may indicate a type of a given file block and the offset/address of that block within the file.

In some embodiments, a file type for each file may be stored in the file header data. Alternatively, the file type of a file may be stored in the file system data.

In some embodiments, a header of a target file may be identified by a header address. According to the techniques described herein, during encoding the header address may be divided into segments and each segment may then be indexed by an offset from the beginning of the target file. In various embodiments, the header address may be encoded into an index that is included in each DNA oligo corresponding to the header address, as described heretofore.

In some embodiments, during encoding the header data of a target file may be divided into segments and each segment may then be indexed by an offset from the beginning of the target file. In various embodiments, each segment of the header data and its corresponding index may be encoded into a corresponding DNA oligo, as described heretofore.

In some embodiments, the encoding operations provide for including redundancy information that enables error detection and/or error recovery. For example, redundancy may be provided for by introducing extra bases during encoding operations, as described heretofore. According to the techniques described herein, since the header of a target file is important for lossless encoding/decoding operation, the file header can be encoded in excess quantity, e.g., more oligos than average can be specified for this purpose. As used herein, "excess" refers to generating, in the DNA oligo mix, multiple (nX) copies of the same DNA oligo, where nX may be in the range of 3× to 10× and/or in any sub-range thereof. For example, in some embodiments the techniques described herein provide for use of excess during encoding in a range of 9×-10×, or a range of 8×-9×, or a range of 7×-8×, or a range of 6×-7×, or a range of 5×-6×, or a range of 4×-5×, or a range of 3×-4×, or any combination of such ranges.

In some embodiments, the techniques described herein provide for using indexing to keep track of the sequential order of the blocks of electronic bits in the target file header. For example, during encoding, a computer system may automatically divide the target file header into segments of bits and assign a sequential index value to each segment to reflect the position/offset of this segment within the file. Thereafter, each segment along with its index value is encoded to DNA bases as described herein, and a DNA oligo representing the segment and its index value is generated by a DNA synthesizing system (e.g., in excess number of copies). During retrieval from the DNA-based storage, the DNA oligos are first sequenced using a DNA sequencing system to generate a set of reads and the set of reads are decoded into segments of electronic bits as described herein. Thereafter, a computer system may assemble the original file header by using the index value of each segment of bits to determine the position/offset of the segment into the file header.

File Content Encoding (Synthesized in Regular Quantity)

In some embodiments, the techniques described herein provide encoding the content of the target files. As used herein, content refers to the section(s) that generally follow(s) the header in binary files, or the whole text file.

In some embodiments, the content of a target file may be identified by a content address. According to the techniques described herein, during encoding the content address may be divided into segments and each segment may then be indexed by an offset from the beginning of the target file. In various embodiments, the content address may be encoded into an index that is included in each DNA oligo corresponding to the content address, as described heretofore.

In some embodiments, during encoding the content data of a target file may be divided into segments and each segment may then be indexed by an offset from the beginning of the target file. In various embodiments, each segment of the content data and its corresponding index may be encoded into a corresponding DNA oligo, as described heretofore.

In some embodiments, the encoding operations provide for including redundancy information that enables error detection and/or error recovery. For example, redundancy may be provided for by introducing extra bases during encoding operations, as described heretofore. According to the techniques described herein, since the content of a target file is not so important for lossless encoding/decoding operation (e.g., an electronic image may be sufficiently recovered even if some bits are lost), the file content can be encoded in regular quantity. As used herein, "regular quantity" refers to generating, in the DNA oligo mix, multiple (nX) copies of the same DNA oligo, where nX may be in the range of 1×±25%. For example, up to 25% of all DNA oligos representing file content may be generated in more than one copy, while DNA oligos may not be generated for up to 25% of the bitwise segments of file content.

In some embodiments, the techniques described herein provide for using indexing to keep track of the sequential order of the blocks of electronic bits in the target file's content. For example, during encoding, a computer system may automatically divide the content of the target file into segments of bits and assign a sequential index value to each segment to reflect the position/offset of this segment within the file content. Thereafter, each segment along with its index value is encoded into DNA bases as described herein, and a DNA oligo representing the segment and its index value is generated by a DNA synthesizing system (e.g., in regular number of copies). During retrieval from the DNA-based storage, the DNA oligos are first sequenced using a DNA sequencing system to generate a set of reads and the set of reads are decoded into segments of electronic bits as described herein. Thereafter, a computer system may assemble the original file content by using the index value of each segment of bits to determine the position/offset of the segment into the file's content.

Example DNA Synthesizer System

FIG. 1 illustrates an example DNA oligo synthesizer system 100 on which the techniques and methods described herein may be implemented. In some embodiments, oligo synthesizer system 100 may be a high throughput, large scale instrument capable of simultaneously synthesizing 48, 92, 192 oligos (or more) in quantities that may range from 2 µMole to several MilliMoles. Oligo synthesizer system 100 is configured to facilitate the joining of single nucleotides (or bases) to form oligos having user-specified sequences. Examples of such oligo synthesizer system include the ABI3900 High-Throughput DNA Synthesizer and Agilent's Oligo Library Synthesis microarray platform (SurePrint), but it is noted that various oligo synthesizer systems available on the market may be suitable for implementing the techniques described herein.

Oligo synthesizer system 100 includes a synthesizer 102 that is communicatively and/or operatively coupled to computer system 140. Synthesizer 102 includes amidite banks 104, reagent banks 106, synthesis chamber 108, and control panel 110. Various fluidic lines, tubing, valves, and other fluidic connections may be used to connect amidite banks 104 and reagent banks 106 to synthesis chamber 106. Amidite banks 104 may be bottles or other containers that store amidates (e.g., such as phoramidites) for the each of the bases A, C, G, T, and other bases (e.g., inosine or synthetic/unnatural bases) that may be used. Reagent banks 106 are used to store various reagents, chemicals, and dyes that are needed during oligo synthesis. For example, reagent banks 106 may be bottles or other containers that store various solutions and mixtures such as, for example, tetrazole-acetonitrile, 1-methyllimidazole-tetrahydrofuran, acetic anhydride-pyridine, iodine-pyridine, etc.

Synthesis chamber 108 is configured to receive solid support structure(s) in which oligos are generated. In some embodiments, the solid support structure may be a cartridge (or plate) with columns, where a column may be a vial that is specifically designed to work with the particular synthesizer system. For example, the cartridge/plate may be designed to hold a number of columns (e.g., 48, 96, 192, etc.), each of which may be used to produce a different oligo within the same cycle. Each column may be prepped prior to oligo synthesis, e.g., by being provided with a first base of an oligo sequence linked to some solid support or bead disposed in the column. In some embodiments, the solid support structure may be a microarray that is designed for in situ synthesis process that "prints" oligos base-by-base. For example, an inkjet-like printing process may be used to deposit oligo monomers onto specific spots in the microarrays, which enables the accurate delivery of small volumes (e.g., picoliters) of the amidites, reagents and other chemicals needed to generate the oligos. Synthesis chamber 108 may also include robotic arms, rails, sleeves or other suitable mechanical and/or electro-mechanical components that are configured to position the dispense tips or nozzles with respect to the solid support structure(s) (e.g., cartridges, microarrays, etc.), wash lines, and waste lines in order to receive and drain amidates, reagents, chemicals, and other fluids during the oligo generation cycles. Control panel 110 may include various buttons, pressure gauges, and control elements that allow a user to operate synthesizer 102.

In some embodiments, synthesizer 102 may be in fluidic connection with bulk reagent containers 120 and waste containers 130. Bulk reagent containers 120 may be bottles or other containers that store various chemicals used during operation. For example, a bulk container 120 may be used to store argon or other inert material that is used to flush the fluidic lines and the columns used in synthesis chamber 108. Waste containers 130 may be bottles or other suitable containers that are used to store any waste fluids that are pumped, drained, or otherwise transferred out of synthesis chamber 108. Synthesizer 102 may also include various other components such as motors, sensors, valves, connectors, etc., that are configured to pump fluids in and out of the various components of the synthesizer.

Computer system 140 is a suitable computing device and may be communicatively coupled to a network 216. Examples of such computer system and network are described below with respect to FIG. 2, but it is noted that any suitable computer system (e.g., a personal system or an embedded system) may be used to implement the techniques described herein. Referring to FIG. 1, computer system 140 is configured to execute software programs that control the operation of synthesizer 102 to generate oligos in accordance with the techniques described herein. For example, computer system 140 may be configured with a suitable software program or application that provides a graphical user interface to allow a user to enter information about the oligos that need to be generated by synthesizer system 100. Through the user interface, a user may enter or otherwise specify the path to the target electronic data—e.g., such as a (local or network) file, directory, or file system for which storage oligos need to be generated. In response, computer system 140 may access the user-specified target data, encode the target data as described heretofore, and generate synthesizer instructions that can be executed or otherwise utilized by synthesizer 102 to generate the corresponding DNA oligos.

In operation, synthesizer system 100 may use a cycle-based protocol to generate oligos having DNA sequences that are specified in synthesizer instruction files (or other suitable data structures) stored in (or otherwise accessed by) computer system 140. A cycle may be specified by instructions stored in file(s) or other suitable data structure(s), which instructions control and direct synthesizer 102 what steps to perform during the generation of an oligo in a given cartridge column or a given a microarray spot. A series of cycles may be programmed by using suitable software that is executed in computer system 140. In order to incorporate a base into a growing oligo, during a cycle a synthesizer may perform a series of steps by applying the appropriate amidites, reagents, and other chemicals on a cartridge column or a microarray spot. Depending on the various types of synthesis, such steps may include: a de-blocking step that produces a free 5'-terminal hydroxyl group in the growing oligos; a coupling step that applies an amidite with the desired base to the free 5'-terminal hydroxyl group; a capping step that applies an appropriate reagent to block any unreacted 5'-terminal hydroxyl groups in the growing oligos; an oxidation step that applies an appropriate (e.g., iodine-based) solution to cap any newly-formed phosphate linkages of the growing oligos; a protection step that applies the appropriate reagent(s) to complete the nucleotide chains of the growing oligos; and a cleaving step that applies the appropriate reagent(s) to cleave the generated oligos from their solid support structure(s) and/or to transfer the oligos in appropriate vials. According to the techniques described herein, computer system 140 and the software executing thereon control and direct synthesizer 102 to generate a set of oligos that represent the electronic data or information in the user-selected file(s), directories, and/or file system(s). For example, different sets of oligos (e.g., possibly in different concentrations or quantities) may be generated to represent the file headers, file contents, directory headers, directory structures, file system headers, and file system structures in accordance with the various embodiments of the techniques described herein.

Example Computer System

Figure 2:
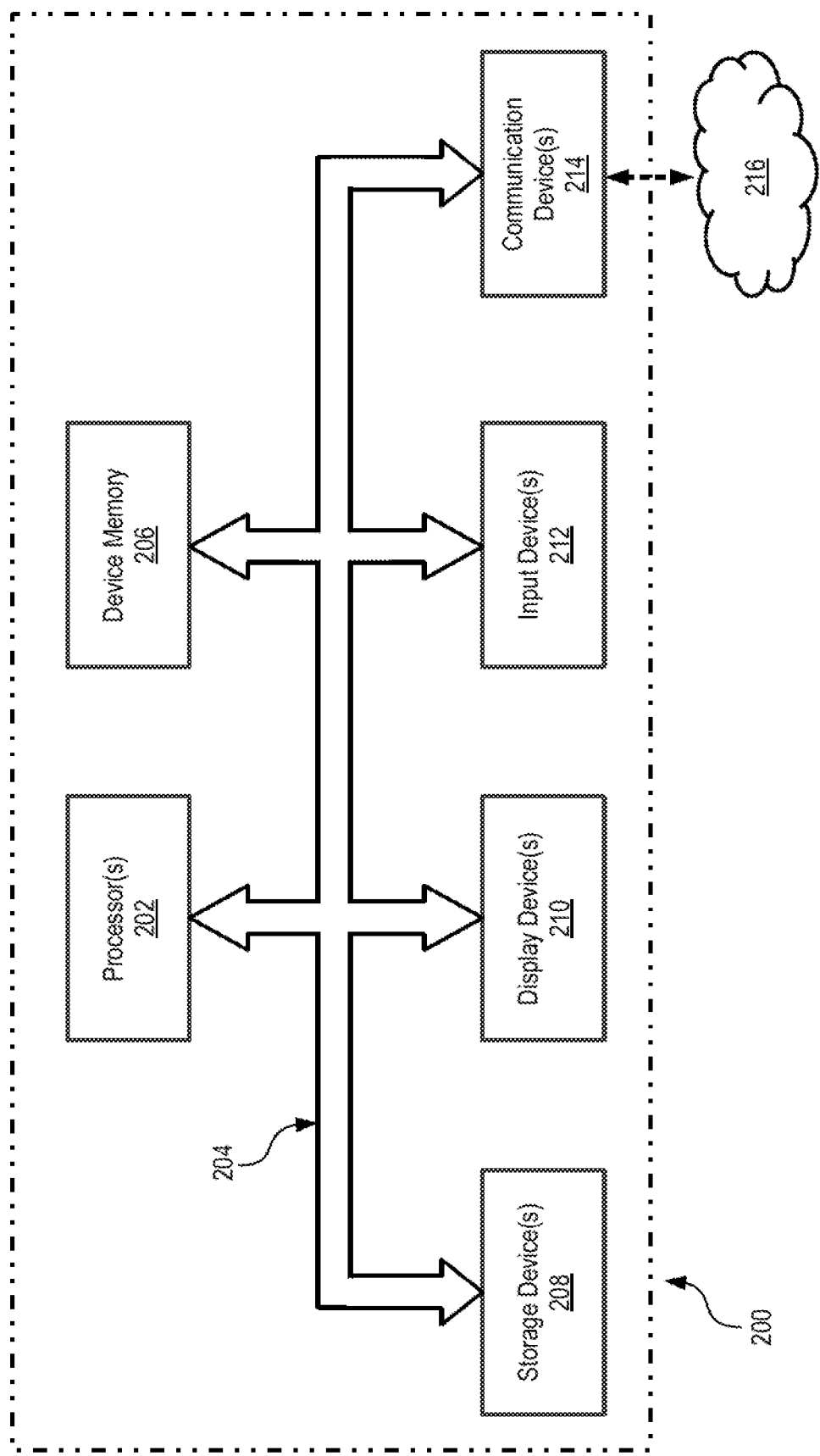
FIG. 2 illustrates an example computing system, according to some embodiments.

FIG. 2 illustrates an example computing device or computer system on which the techniques and methods for DNA-based storage described herein may be implemented. Computer system 200 includes, but is not limited to, one or more processors 202 operationally coupled to memory 206 over one or more buses such as bus 204. Depending on specific implementations and form factors, computer system 200 may also include storage device(s) 208, display device(s) 210, input device(s) 212, and communication device(s) 214.

A processor 202 is a hardware device configured to execute sequences of instructions in order to perform various operations such as, for example, arithmetical, logical, and input/output operations. A typical example of a processor is a central processing unit (CPU), but it is noted that other types of processors such as vector processors and array processors can perform similar operations. Examples of hardware devices that can operate as processors include, but are not limited to, microprocessors, microcontrollers, digital signal processors (DSPs), systems-on-chip, and the like. Processor 202 is configured to receive executable instructions over one or more data and/or address buses such as bus 204. Bus 204 is configured to couple various device components, including memory 206, to processor(s) 202. Bus 204 may include one or more bus structures (e.g., such as a memory bus or memory controller, a peripheral bus, and a local bus) that may have any of a variety of bus architectures. Memory 206 is configured to store data and executable instructions for processor(s) 202. Memory 206 may include volatile and/or non-volatile memory such as read-only memory (ROM) and random-access memory (RAM). For example, a basic input/output system (BIOS) containing the basic executable instructions for transferring information between system components (e.g., during start-up) is typically stored in ROM. RAM typically stores data and executable instructions that are immediately accessible and/or being operated on by processor(s) 202 during execution. Memory 206 is an example of non-transitory computer-readable medium.

Computer-readable media may include any available medium that can be accessed by a computer system (and/or the processors thereof) and includes both volatile and non-volatile media and removable and non-removable media. One example of non-transitory computer-readable media is storage media. Storage media includes media implemented in any method or technology for storage of information such as computer-readable instructions, data structures, program modules, and/or other data. Examples of storage media include, but are not limited to, RAM, ROM, electrically erasable programmable read-only memory (EEPROM), removable memory such as flash memory and solid state drives (SSD), compact-disk read-only memory (CD-ROM), digital versatile disks (DVD) and other optical disks, magnetic cassettes, magnetic tapes, magnetic disks or other magnetic storage devices, electromagnetic disks, and any other medium which can be used to store the desired information and which can be accessed and read by a computer system. Another example of computer-readable media is communication media. Communication media typically embody computer-readable instructions, data structures, program modules, or other data, in a modulated data signal such as a carrier wave or other transport mechanism and includes any information delivery media. By way of example, and not limitation, communication media includes wired media such as a wired network or direct-wired connection, and wireless media such as acoustic, radio frequency (RF), infrared and other wireless media.

Computer system 200 may include, and/or have access to, various non-transitory computer-readable media that is embodied in one or more storage devices 208. Storage device(s) 208 may be coupled to processors(s) 202 over one or more buses such as bus 204. Storage device(s) 208 are configured to provide persistent storage of executable and other computer-readable instructions, data structures, program modules, and other data for computer system 200 and/or for its users. In various embodiments and form factors of computer system 200, storage device(s) 208 may include persistent storage media of one or more types including, but not limited to, electromagnetic disks (e.g., hard disks), optical storage disks (e.g., DVDs and CD-ROMs), magneto-optical storage disks, solid-state drives, flash memory cards, universal serial bus (USB) flash drives, and the like. By way of example, storage device(s) 208 may include a hard disk drive that stores the executable instructions of an Operating System (OS) for computer system 200, the executable instructions of one or more computer programs, clients, and other computer processes that can be executed on the computer system, and any OS and/or user data in various formats.

Computer system 200 may also include one or more display devices 210 and one or more input devices 212 that are coupled to processor(s) 202 over one or more buses such as bus 204. Display device(s) 210 may include any devices configured to receive information from, and/or present information to, user(s) of computer system 200. Examples of such display devices include, but are not limited to, cathode-ray tube (CRT) monitors, liquid crystal displays (LCDs), light emitting diode (LED) displays, field emission (FED, or "flat panel" CRT) displays, plasma displays, electro-luminescent displays, and any other types of display devices. Input device(s) 212 may include a general pointing device (e.g., such as a computer mouse, a trackpad, or an equivalent spatial-input device), an alphanumeric input device (e.g., such as a keyboard), and/or any other suitable human interface device (HID) that can communicate commands and other user-generated information to processor(s) 202.

Computer system 200 may include one or more communication devices 214 that are coupled to processor(s) 202 over one or more buses such as bus 204. Communication device(s) 214 are configured to receive and transmit data from and to other devices and computer systems. For example, communication device(s) 214 may include one or more USB controllers for communicating with USB peripheral devices, one or more network storage controllers for communicating with storage area network (SAN) devices and/or network-attached storage (NAS) devices, one or more network interface cards (NICs) for communicating over wired communication networks, and/or one or more wireless network cards for communicating over a variety of wireless data-transmission protocols such as, for example, IEEE 802.11 and/or Bluetooth. Using communication device(s) 214, computer system 200 may operate in a networked environment using logical and/or physical connections to one or more remote computer systems and/or other computing devices. For example, computer system 200 may be connected to one or more remote computers that provide access to block-level data storage over a SAN protocol and/or to file-level data storage over a NAS protocol. In another example, computer system 200 may be connected to one or more networks 216 over connections that support one or more networking protocols. Network(s) 216 may include, without limitation, a local area network (LAN), a wide area network (WAN), a global network (e.g., the Internet), and/or any other type of network or combination of networks.

Some embodiments of the techniques for DNA-based storage described herein may be implemented as a computer program product that may include sequences of instructions stored on non-transitory computer-readable media. These instructions may be used to program one or more computer systems that include one or more special-purpose or general-purpose processors (e.g., CPUs) or equivalents thereof (e.g., such as processing engines, processing cores, etc). When executed by the processor(s), the sequences of instructions cause the computer system(s) to perform the operations according to some of the embodiments of the techniques described herein. Additionally or instead of, some embodiments of the techniques described herein may be practiced in distributed computing environments that may involve more than one computer system. One example of a distributed computing environment is a client-server environment, in which some of the various functions of the techniques described herein may be performed by a client program product executing on a computer system and some of the functions may be performed by a server program product executing on a server computer. Another example of a distributed computing environment is a cloud computing environment. In a cloud computing environment, computing resources are provided and delivered as a service over a network such as a local-area network (e.g., LAN) or a wide-area network (e.g., the Internet). Examples of cloud-based computing resources may include, without limitation: physical infrastructure resources (e.g., physical computing devices or computer systems, and virtual machines executing thereon) that are allocated on-demand to perform particular tasks and functions; platform infrastructure resources (e.g., an OS, programming language execution environments, database servers, web servers, etc.) that are installed/imaged on-demand onto the allocated physical infrastructure resources; and application software resources (e.g., application servers, single-tenant and multi-tenant software platforms, etc.) that are instantiated and executed on-demand in the environment provided by the platform infrastructure resources. Another example of a distributed computing environment is a computing cluster environment, in which multiple computing devices each with its own OS instance are connected over a fast local network. Another example of a distributed computing environment is a grid computing environment in which multiple, possibly heterogeneous and/or geographically dispersed, computing devices are connected over conventional network(s) to perform a common task or goal. In various distributed computing environments, the information transferred between the various computing devices may be pulled or pushed across the transmission medium that connects the computing devices.

Figure 3:
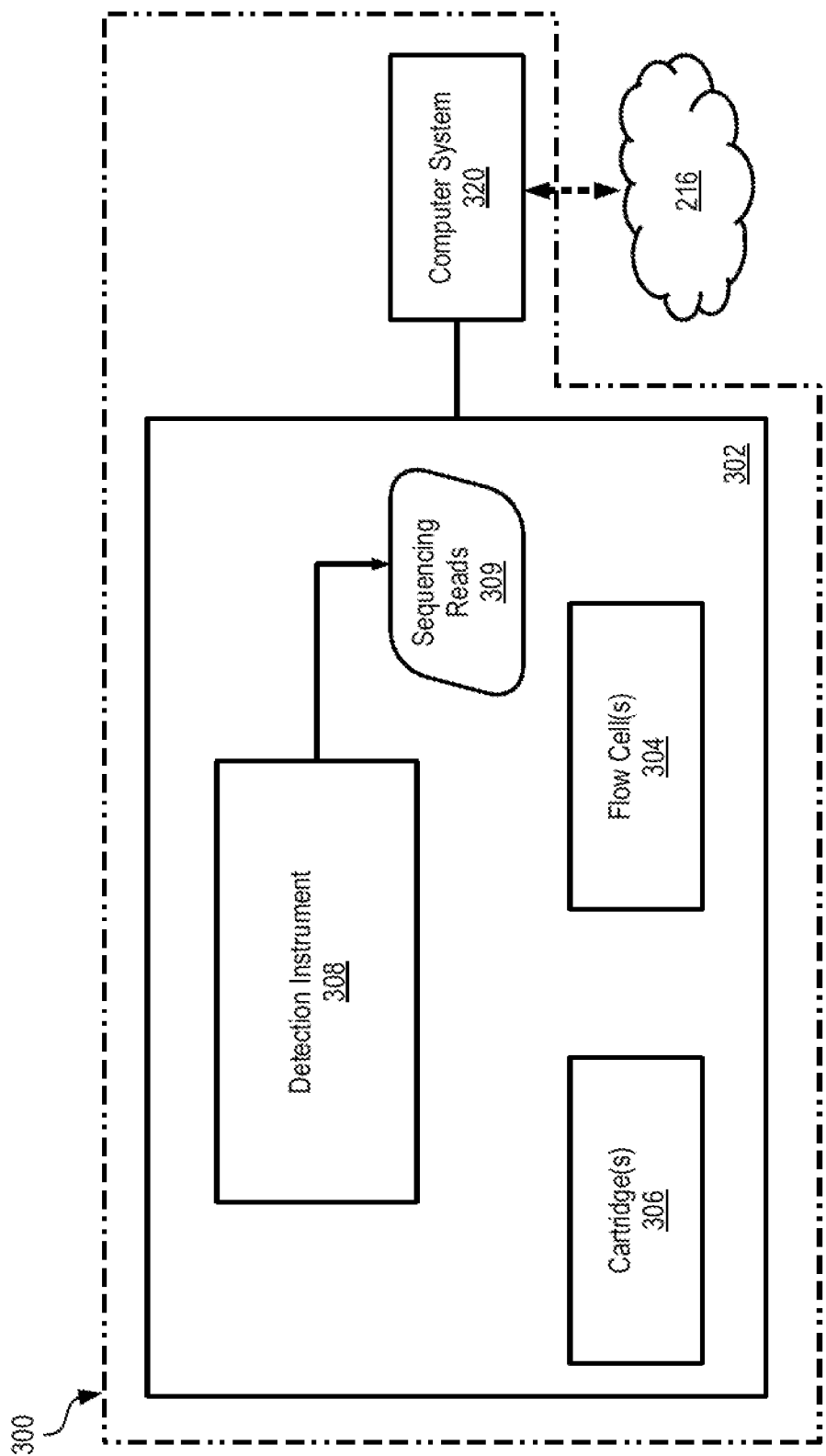
FIG. 3 illustrates an example DNA sequencing system, according to some embodiments.

Some embodiments of the techniques for DNA-based storage described herein may be implemented by a computer system that is included, embedded, or otherwise provided with/within a DNA synthesizer system (e.g., such as synthesizer system 100 in FIG. 1) or a DNA sequencing system (e.g., such as sequencing system 300 in FIG. 3). In such form factor, the DNA synthesizer system or the DNA sequencing system may be set up with the necessary materials to perform the necessary DNA synthesis or DNA sequencing, respectively, while the computer system may be configured to perform any necessary computing tasks such as causing the DNA synthesizer system or the DNA sequencing system to perform the method steps for synthesis and sequencing as described herein.

Example DNA Sequencing System

FIG. 3 illustrates an example DNA sequencing system 300 on which the techniques and methods described herein may be implemented. In some embodiments, DNA sequencing system 300 may be a high throughput instrument capable of sequencing oligos by using any suitable next generation sequencing (NGS) technology. Examples of such DNA sequencing systems include, without limitation, the MiSeq, HiSeq and NextSeq sequencers manufactured by Illumina, Inc., and Ion Proton systems manufactured by Life Technologies, Inc. It is noted, however, that various other DNA sequencing systems available on the market may be suitable for implementing the techniques described herein.

DNA sequencing system 300 includes a sequencing device (sequencer) 302 that is communicatively and/or operatively coupled to computer system 320. Sequencer 302 includes compartments that can accept flow cell(s) or slides 304 with the oligos being sequenced (target oligos), cartridge(s) 306 with the sequencing reagents and buffers used during sequencing, and detection instrument 308 which performs the sequencing. Various fluidic lines, tubing, valves, and other fluidic connections may be used to connect the compartments with flow cell(s) or slides 304 and cartridge(s) 306 to detection instrument 308. A flow cell 304 may include a housing that encloses a solid support (e.g., a microarray, a chip, beads, etc.), with one or more ports being provided for loading the target oligos into the flow cell and for administering the various reagents and buffers during sequencing cycles. In some sequencing systems, the target oligos may be pre-processed into libraries by applying thereto various chemical steps such as denaturing, diluting, etc. A cartridge 306 is used to store various sequencing reagents, buffers, chemicals, as well as any waste that are needed or produced during sequencing. For example, a cartridge 306 may include suitable storage reservoirs that store denaturation agents (e.g., formamide), wash solutions, probes, etc.

Detection instrument 308 is configured to detect the DNA sequences of the target oligos and to generate reads 309. In various embodiments, detection instrument 308 may utilize various sequencing mechanisms such as, for example, sequencing by synthesis, sequencing by ligation, sequencing by hybridization, etc., where such mechanisms may be employed in massively-parallel fashion in order to increase throughput. Further, in various embodiments detection instrument 308 may detect the DNA bases of the target oligos by using optical-based detection, semiconductor-based (or electronic) detection, electrical-based (e.g., nanopore) detection, etc. In various embodiments, detection instrument 308 may also include various suitable mechanical and/or electro-mechanical components that may be configured to position the flow cell 304 at the beginning and/or during sequencing.

Computer system 320 is a suitable computing device and may be communicatively coupled to a network 216. Examples of such computer system and network are described above with respect to FIG. 2. Referring to FIG. 3, computer system 320 is configured to execute software programs that control the operation of sequencer 302 to generate the reads 309 that represent the DNA sequences of the target oligos, in accordance with the techniques described herein. For example, computer system 320 may be configured with suitable software program(s) or application(s) that control the various sequencing cycles performed by sequencer 302. In addition, in some embodiments computer system 320 may be further configured to perform various post-sequencing steps in accordance with the techniques described herein such as, for example, performing error correction on reads 309, assembling longer reads from the generated reads 309, etc.

In operation, computer system 320 controls the operation of DNA sequencing system 300. Sequencing system 300 is first loaded with flow cell(s) or slides 304 that contain the target oligos and with the sequencing cartridge(s) 306. Prior to and/or after loading the flow cells/slides, the target oligos may be amplified (e.g., by using polymerase chain reaction, PCR) in order to preserve a sufficient amount for each read. Then the system performs its sequencing cycles and generates sequencing reads 309 that represent the DNA sequences of the target oligos. A read is generally a sequence of data values that represent (fully or partially) the DNA sequence of a corresponding target oligo. According to the techniques described herein, computer system 320 and the software executing thereon then cause performance the methods described herein for retrieving the file system stored in the target oligos. For example, computer system 320 and the software executing thereon may decode the information in reads 309 to obtain the metadata of the file system from a first set of reads, the file headers of the files from a second set of reads, and the contents of the files from a third set of reads, as described heretofore.

Example 1: Methods for Storing Electronic Data on DNA-Based Storage

Figure 4:
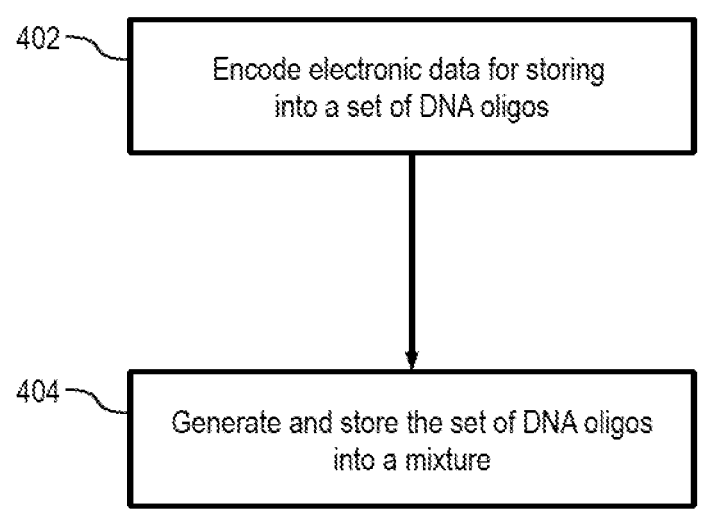
FIG. 4 illustrates an example method for storing electronic data into DNA-based storage, according to some embodiments.

FIG. 4 illustrates an example method of storing electronic data into DNA-based storage. The operations of the method in FIG. 4 are described as being performed by a computer system and a DNA synthesizer system and/or a combination thereof. It is noted, however, that various implementations and embodiments may use various, and possibly different, combination of components to perform the operations of the method in FIG. 4. In addition, in various implementations and embodiments the order of the sub-operations of the method in FIG. 4 may be altered so that certain sub-operations may be performed in different order or so that certain sub-operations may be performed, at least in part, concurrently and/or in parallel with other operations and sub-operations. Thus, the description hereinafter of the method in FIG. 4 is to be regarded in an illustrative rather than a restrictive sense.

In operation 402, a computer system encodes the target electronic data for storing into DNA-based storage. In some embodiments, the electronic data may include a file system (including directory and sub-directory information thereof), file headers of the files in the file system, and/or the content of the individual file. As part of the encoding operation, in some embodiments the computer system may use indexing to keep track of the sequential order of the blocks of electronic bits that comprise the target electronic data (e.g., the file system data, the file headers, and/or the files' contents). For example, during encoding, a computer system may automatically divide the content of the target electronic data into segments of bits and assign a sequential index value to each segment to reflect the position/offset of this segment within the target data.

In some embodiments, the computer system may process the file system information to determine the paths, file names, and file types of the files in the various directories and sub-directories of the file system. The information representing the file system is then encoded and stored into synthesizer instruction file(s) or other suitable data structures that can be read by a DNA synthesizer system. For example, the paths, file names and file types of the files may be encoded into data values representing the four DNA bases (A, C, G, T) along with other information necessary for decoding (e.g., such as file IDs, sequence tags, etc). Such encoding may be performed, for instance, based on base-4 or base-8 code sets and may also utilize look-up tables that store black-listed codes and block-type error correction, as described heretofore. In addition, the computer system may also specify in the synthesizer instruction file(s) that the file system information is to be encoded in super excess, thereby ensuring that the critical file system information would have sufficient redundancy when transferred onto the DNA based storage.

In the same and/or different embodiments, the computer system may also access/process each file in the file system to determine the file ID, the file type, the header address, and the header data of the file. The information representing the file is then encoded and stored into synthesizer instruction file(s) or other suitable data structures that can be read by a DNA synthesizer system. For example, a file ID may be determined/assigned to the file, and the file ID along with the file type, the header address, and/or the header data of the file may be encoded into data values representing the four DNA bases (A, C, G, T) along with other information necessary for decoding (e.g., such as sequence tags, etc). Such encoding may be performed, for instance, based on base-4 or base-8 code sets and may also utilize look-up tables that store black-listed codes and block-type error correction, as described heretofore. In addition, the computer system may also specify in the synthesizer instruction file(s) that the file information is to be encoded in excess, thereby ensuring that there would be sufficient redundancy when the encoded information transferred onto the DNA based storage.

In the same and/or different embodiments, the computer system may also access/process the content of each file to determine the content address and the content data of the file. The information representing the file content is then encoded and stored into synthesizer instruction file(s) or other suitable data structures that can read by a DNA synthesizer system. For example, the content address and the content data of the file may be encoded into data values representing the four DNA bases (A, C, G, T) along with other information necessary for decoding (e.g., such as sequence tags, etc). Such encoding may be performed, for instance, based on base-4 or base-8 code sets and may also utilize look-up tables that store black-listed codes and block-type error correction, as described heretofore. In addition, the computer system may also specify in the synthesizer instruction file(s) that the file information is to be encoded in regular quantity, thereby ensuring that there would be acceptable redundancy when the encoded information transferred onto the DNA based storage.

In operation 404, a DNA synthesizer system generates and stores a set of DNA oligos based on the synthesizer instruction file(s) (or other data structures) that were (or are being) generated in operation 402 and/or its sub-operations. According to the techniques described herein, the DNA synthesizer system uses the synthesizer instruction files to generate a set of DNA oligos that represent the target electronic data and stores the generated DNA oligos into a mixture in suitable container(s) such as vials, tubes, etc. The containers with the mixture of the generated DNA oligos may then be stored practically indefinitely under the proper conditions. For example, in some operational scenarios the DNA oligos may be stored as a rehydrate or elute DNA mixture in a TE buffer (10 mM Tris pH 8.0, 1 mM EDTA). The sealed/capped containers (e.g., such polypropylene tubes, polyethylene tubes, polyallomer tubes, microtubes, microplates, and others) may be stored at 4° C. or at room temperature.

In this manner, the techniques described herein provide for encoding and storing electronic data in DNA-based storage.

Example 2: Methods for Retrieving Electronic Data from DNA-Based Storage

Figure 5:
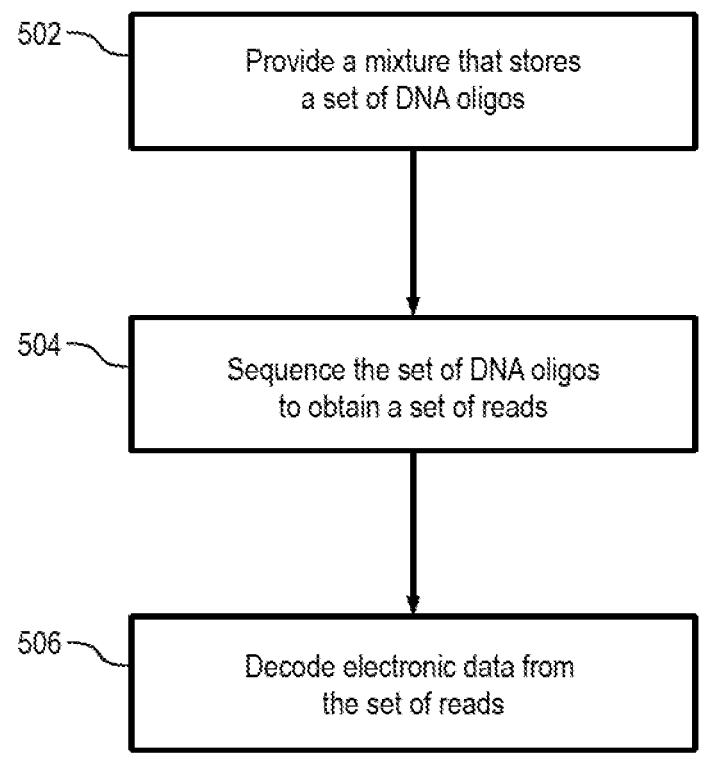
FIG. 5 illustrates an example method for retrieving electronic data from DNA-based storage, according to some embodiments.

FIG. 5 illustrates an example method of retrieving electronic data from DNA-based storage. The operations of the method in FIG. 5 are described as being performed by a DNA sequencing system and a computer system and/or a combination thereof. It is noted, however, that various implementations and embodiments may use various, and possibly different, combination of components to perform the operations of the method in FIG. 5. In addition, in various implementations and embodiments the order of the sub-operations of the method in FIG. 5 may be altered so that certain sub-operations may be performed in different order or so that certain sub-operations may be performed, at least in part, concurrently and/or in parallel with other operations and sub-operations. Thus, the description hereinafter of the method in FIG. 5 is to be regarded in an illustrative rather than a restrictive sense.

In operation 502, a mixture storing a set of DNA oligos is provided. For example, the mixture may be transferred from a storage container (e.g., a vial, tube, etc.) onto a flow cell or slide, and the flow cell or slide may be loaded into a DNA sequencing system. (It is noted that in some implementations, the mixture of DNA oligos may first be amplified by using various amplification methods (e.g., such as PCR), in order to ensure that sufficient amount of each DNA oligo would remain after sequencing.)

In operation 504, the DNA sequencing system performs its sequencing cycles and generates sequencing reads that represent the DNA sequences of the DNA oligos in the provided mixture. Each read is a sequence of data values that represent (fully or partially) the DNA sequence of a corresponding oligo and/or any index stored in the oligo. The generated reads are then stored on electronic storage for further processing.

In operation 506, a computer system then decodes the electronic data that is stored in the set of DNA oligos in accordance with the techniques described herein. For example, a software program product executing on the computer system may decode and assemble the information in the sequencing reads to obtain the metadata of the file system, the file headers of the files, and the contents of the files the assembled reads. In some embodiments, such decoding may be performed, for instance, based on base-4 or base-8 code sets and may also utilize look-up tables that store black-listed codes and block-type error correction, as described heretofore. For example, as part of or after decoding the sequencing reads into segments of bits, the computer system may assemble the segments of bits into the original file system data, file headers, and/or file contents by using the index values associated with the segments of bits to determine their corresponding positions/offsets in the target data.

In this manner, the techniques described herein provide for retrieving electronic data that is stored in DNA-based storage.

CONCLUSION

Various embodiments of the techniques described herein for DNA-based storage of electronic data/information may include various operations and sub-operations. These operations may be performed and/or controlled/caused by hardware components, firmware, and/or combinations thereof. Certain embodiments may be implemented as a computer program product that may include instructions stored on a non-transitory computer-readable medium, e.g., such as volatile memory and/or non-volatile memory. These instructions may be used to program and/or control one or more systems (e.g., such as DNA synthesizer systems, DNA sequencing systems, computer systems, etc.) that include one or more general-purpose or special-purpose processors (e.g., such as CPUs) or equivalents thereof (e.g., such as processing cores, processing engines, microcontrollers, and the like), so that when executed by the processor(s) or the equivalents thereof, the instructions cause the system(s) to perform the operations and sub-operations of the methods described herein.

Although the operations and sub-operations of the method(s) herein are shown and described in a particular order, in some embodiments the order of the operations and sub-operations of each method may be altered so that certain operations may be performed in an inverse or alternating order or so that certain operation/sub-operation may be performed, at least in part, concurrently and/or in parallel with other operation(s)/sub-operation(s).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method of storing a plurality of files in deoxyribonucleic acid (DNA)-based storage, the method comprising:
   encoding the plurality of files in a set of DNA oligos, wherein encoding the plurality of files comprises:
   a DNA synthesizer system synthesizing first DNA oligos, wherein the first DNA oligos encode first type of segments from the plurality of files; and
   the DNA synthesizer system synthesizing second DNA oligos that encode second type of segments from the plurality of files;
   wherein the second type of segments include different information content than the first type of segments; and
   wherein the first DNA oligos are synthesized in excess compared to the second DNA oligos.

2. The method of claim 1, wherein each one of the first DNA oligos and the second DNA oligos encodes a file identifier that identifies at least a file type of a respective file of the plurality of files.

3. The method of claim 2, wherein the file type is a binary file type.

4. The method of claim 1, wherein the first DNA oligos are synthesized in excess per base compared to the second DNA oligos.

5. The method of claim 1, wherein the first DNA oligos are synthesized in excess per number of copies compared to the second DNA oligos.

6. The method of claim 1, wherein encoding the plurality of files comprises a computer system using a code set to generate:
   first synthesizer instructions that correspond to the first type of segments from the plurality of files; and
   second synthesizer instructions that correspond to the second type of segments from the plurality of files.

7. The method of claim 1, wherein encoding the plurality of files comprises a computer system using a code set with parity bases to generate synthesizer instructions that correspond to the first type of segments from the plurality of files and to the second type of segments from the plurality of files.

8. The method of claim 1, wherein encoding the plurality of files comprises a computer system using a code set with block-type error correction to generate synthesizer instructions that correspond to the first type of segments from the plurality of files and to the second type of segments from the plurality of files.

9. The method of claim 1, wherein encoding the plurality of files comprises a computer system using a code set with black-listed codes to generate synthesizer instructions that correspond to the first type of segments from the plurality of files and to the second type of segments from the plurality of files.

10. The method of claim 1, further comprising:
  causing the DNA synthesizer system to add the first DNA oligos and the second DNA oligos into a mixture; and
  causing the DNA synthesizer system to store the mixture into one or more containers.

11. A method of storing a file in deoxyribonucleic acid (DNA)-based storage, the method comprising:
  encoding the file in a set of DNA oligos, wherein encoding the file comprises:
    a DNA synthesizer system synthesizing first DNA oligos, wherein the first DNA oligos encode a first type of segment from the file; and
    the DNA synthesizer system synthesizing second DNA oligos that encode a second type of segment from the file;
    wherein the second type of segment includes different information content than the first type of segment; and
    wherein the first DNA oligos are synthesized in excess compared to the second DNA oligos.

12. The method of claim 11, wherein at least one of the first DNA oligos and the second DNA oligos encodes a file identifier that identifies at least a file type of the file.

13. The method of claim 12, wherein the file type is a binary file type.

14. The method of claim 11, wherein the first DNA oligos are synthesized in excess per base compared to the second DNA oligos.

15. The method of claim 11, wherein the first DNA oligos are synthesized in excess per number of copies compared to the second DNA oligos.

16. The method of claim 11, wherein encoding the file comprises a computer system using a code set to generate:
  first synthesizer instructions that correspond to the first type of segment from the file; and
  second synthesizer instructions that correspond to the second type of segment from the file.

17. The method of claim 11, wherein encoding the file comprises a computer system using a code set with parity bases to generate synthesizer instructions that correspond to the first type of segment from the file and to the second type of segment from the file.

18. The method of claim 11, wherein encoding the file comprises a computer system using a code set with block-type error correction to generate synthesizer instructions that correspond to the first type of segment from the file and to the second type of segment from the file.

19. The method of claim 11, wherein encoding the file comprises a computer system using a code set with black-listed codes to generate synthesizer instructions that correspond to the first type of segment from the file and to the second type of segment from the file.

20. The method of claim 11, further comprising:
  causing the DNA synthesizer system to add the first DNA oligos and the second DNA oligos into a mixture; and
  causing the DNA synthesizer system to store the mixture into one or more containers.

\* \* \* \* \*

SEQUENCE LISTING

<160> NUMBER OF SEQ ID NOS: 4

<210> SEQ ID NO 1
<211> LENGTH: 3
<212> TYPE: DNA
<213> ORGANISM: Artificial Sequence
<220> FEATURE:

-continued

```
<223> OTHER INFORMATION: May be a sequence in a naturally-occurring
      nucleic acid

<400> SEQUENCE: 1 ggg                                                                 3

<210> SEQ ID NO 2
<211> LENGTH: 5
<212> TYPE: DNA
<213> ORGANISM: Artificial Sequence
<220> FEATURE:
<223> OTHER INFORMATION: May be a sequence in a naturally-occurring
      nucleic acid

<400> SEQUENCE: 2 aaaaa                                                               5

<210> SEQ ID NO 3
<211> LENGTH: 5
<212> TYPE: DNA
<213> ORGANISM: Artificial Sequence
<220> FEATURE:
<223> OTHER INFORMATION: May be a sequence in a naturally-occurring
      nucleic acid

<400> SEQUENCE: 3 tgaac                                                               5

<210> SEQ ID NO 4
<211> LENGTH: 5
<212> TYPE: DNA
<213> ORGANISM: Artificial Sequence
<220> FEATURE:
<223> OTHER INFORMATION: May be a sequence in a naturally-occurring
      nucleic acid

<400> SEQUENCE: 4 gtgtt                                                               5
```